(12) United States Patent
Ryu et al.

(10) Patent No.: US 6,946,703 B2
(45) Date of Patent: Sep. 20, 2005

(54) SONOS MEMORY DEVICE HAVING SIDE GATE STACKS AND METHOD OF MANUFACTURING THE SAME

(75) Inventors: Won-il Ryu, Seoul (KR); Jo-won Lee, Suwon-si (KR); Se-wook Yoon, Seoul (KR); Chung-woo Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/753,772

(22) Filed: Jan. 9, 2004

(65) Prior Publication Data

US 2004/0207002 A1 Oct. 21, 2004

(30) Foreign Application Priority Data

Jan. 9, 2003 (KR) ................... 10-2003-0001311

(51) Int. Cl.[7] ............................................. H01L 29/788
(52) U.S. Cl. ..................... 257/315; 257/324; 257/327; 257/412; 257/E29.309; 257/E29.322
(58) Field of Search ................. 257/324, 327, 257/412, E29.309, E29.322

(56) References Cited

U.S. PATENT DOCUMENTS 6,313,503 B1 * 11/2001 Lee et al. .................. 257/324

* cited by examiner

Primary Examiner—David Nelms
Assistant Examiner—Mai-Huong Tran
(74) Attorney, Agent, or Firm—Lee & Morse, P.C.

(57) ABSTRACT

In a silicon-oxide-nitride-oxide-silicon (SONOS) memory device and a method of manufacturing the same, a SONOS memory device includes a semiconductor substrate, an insulating layer deposited on the semiconductor substrate, an active layer formed on a predetermined region of the insulating layer and divided into a source region, a drain region, and a channel region, a first side gate stack formed at a first side of the channel region, and a second side gate stack formed at a second side of the channel region opposite the first side of the channel region. In the SONOS memory device, at least two bits of data may be stored in each SONOS memory device, thereby allowing the integration density of the semiconductor memory device to be increased without increasing an area thereof.

24 Claims, 12 Drawing Sheets

SONOS MEMORY DEVICE HAVING SIDE GATE STACKS AND METHOD OF MANUFACTURING THE SAME

BACKGROUND OF THE INVENTION

1. Field of the Invention

The present invention relates to a semiconductor memory device and a method of manufacturing the same. More particularly, the present invention relates to a silicon-oxide-nitride-oxide-silicon (SONOS) memory device having an enhanced integration density without increasing an area of the semiconductor memory device and a method of manufacturing the same.

2. Description of the Related Art

Data storage capacity of a semiconductor memory device is proportional to the number of memory cells per unit area, or integration density, of the device.

Typically, each memory cell consists of one transistor and one capacitor. Therefore, it is possible to enhance the integration density of a semiconductor memory device by scaling-down a size of the transistor and the capacitor. Since early semiconductor memory devices of low integration density have sufficient margins for a photo-etching process, scaling-down of transistors and capacitors has had a positive effect to some degree.

The integration density of a semiconductor memory device is closely related to a design rule applied in a semiconductor manufacturing process. In order to enhance the integration density of the semiconductor memory device, the design rule should be strictly respected. The strictly respected design rule implies a reduction of the margins for a photo-etching process and demands precision in the photo-etching process.

In most cases, reduction of the margins in the photo-etching process results in the degradation of yield in the semiconductor manufacturing process. Therefore, it is necessary to develop a new method for enhancing integration density of a semiconductor memory device while preventing degradation in the yield thereof.

In an effort to enhance integration density of a semiconductor memory device, novel semiconductor memory devices have been introduced, which are differently configured from a conventional memory cell and have a data storage medium different from a conventional capacitor, e.g., giant magnetoresistance (GMR) or tunneling magnetoresistance (TMR), on a transistor.

A silicon-oxide-nitride-oxide-silicon (SONOS) memory device is one type of the newly introduced semiconductor memory devices. FIG. 1 illustrates a cross-section of a conventional SONOS memory device.

Referring to FIG. 1, the conventional SONOS memory device includes a p-type semiconductor substrate 10 and a gate stack 11 placed on a predetermined region of the p-type semiconductor substrate 10. A source region 12 and a drain region 14 are formed in the p-type semiconductor substrate 10 at sides of the gate stack 11, to which an n-type conductive impurity is implanted. The source region 12 and the drain region 14 are extended under portions of the gate stack 11. A channel region 16 is formed between the source region 12 and the drain region 14 under the gate stack 11. The gate stack 11 includes a memory node 24 formed on a predetermined region including the channel region 16 of the p-type semiconductor substrate 10, and a gate conductive layer 26, i.e., a control gate, formed on the memory node 24. The memory node 24 includes a tunneling oxide layer 18 formed on the predetermined region including the channel region 16 of the p-type semiconductor substrate 10, a nitride layer 20 formed on the tunneling oxide layer 18, and a blocking oxide layer 22 formed on the nitride layer 20. The nitride layer 20 is used to trap electrons tunneling into the tunneling oxide layer 18 and has trap sites therein. Reference numeral 28 indicates electrons trapped in the nitride layer 20. The blocking oxide layer 22 is used to prevent the electrons trapped in the nitride layer 20 from moving to the gate conductive layer 26.

Since the conventional SONOS memory device has only one threshold voltage, only one data value can be stored therein. Thus, in order to store more data, more SONOS memory devices are needed in proportion to the number of data. Therefore, in order to store more data, the integration density of the semiconductor memory device should be increased. To increase the integration density of the semiconductor memory device, it is necessary to reduce the size of the memory device shown in FIG. 1. Thus, the strictly respected design rule should be applied in the photo-etching process. However, this is a difficult task because of limitations of an exposure process, such as a limitation of resolution.

As such, although the integration density of the conventional SONOS memory device may be enhanced as compared with the conventional memory cell, the extent of such enhancement is limited due to limitations of the exposure process.

SUMMARY OF THE INVENTION

The present invention provides a silicon-oxide-nitride-oxide-silicon (SONOS) memory device that makes high-density storage possible while enhancing integration density of a semiconductor memory device without requiring scaling-down of memory device components.

The present invention further provides a method of manufacturing the SONOS memory device.

It is a feature of a first embodiment of the present invention to provide a silicon-oxide-nitride-oxide-silicon (SONOS) memory device including a semiconductor substrate, an insulating layer formed on the semiconductor substrate, an active layer formed on a predetermined region of the insulating layer and divided into a source region, a drain region, and a channel region, a first side gate stack formed at a first side of the channel region, and a second side gate stack formed at a second side of the channel region opposite the first side of the channel region.

In the SONOS memory device, the active layer may be a semiconductor silicon layer. Alternatively, the active layer may have a carbon nano tube structure.

The first and second side gate stacks may be formed symmetrically with respect to each other. Alternatively, the first and second side gate stacks may be formed asymmetrically with respect to each other.

The first side gate stack preferably includes a first memory node and a first side gate conductive layer that are sequentially stacked at the first side of the channel region, and the second side gate stack preferably includes a second memory node and a second side gate conductive layer that are sequentially stacked at the second side of the channel region.

The first and the second memory nodes may be extended over a top surface of the channel region and may be connected to each other. Further, a gate conductive layer may be formed on the first and second memory nodes that are extended over the top surface of the channel region and connected to each other.

The first memory node preferably includes a first tunneling oxide layer, a first trapping layer, and a first blocking oxide layer that are sequentially stacked at the first side of the channel region, and the second memory node preferably includes a second tunneling oxide layer, a second trapping layer, and a second blocking oxide layer that are sequentially stacked at the second side of the channel region.

In an embodiment of the present invention, thicknesses of the first and second tunneling oxide layers may be equal to each other. Also, thicknesses of the first and second blocking oxide layers may be equal to each other. Thicknesses of the first and second blocking oxide layers may be respectively greater than the thicknesses of the first and the second tunneling oxide layers.

In another embodiment of the present invention in which the first and second side gate stacks are formed asymmetrically with respect to each other, a thickness of the first tunneling oxide layer may be equal to a thickness of the first blocking oxide layer. Also, a thickness of the second tunneling oxide layer may be equal to a thickness of the second blocking oxide layer. However, thicknesses of the second tunneling oxide layer and the second blocking oxide layer are respectively greater than thicknesses of the first tunneling oxide layer and the first blocking oxide layer.

A thickness of the first tunneling oxide layer may be equal to a thickness of the second tunneling oxide layer, and a thickness of the second blocking oxide layer may be greater than a thickness of the first blocking oxide layer.

A thickness of the first trapping layer may be smaller than a thickness of the second trapping layer.

A thickness of the first trapping layer may be equal to a thickness of the second trapping layer, and a thickness of at least one of the second tunneling oxide layer and the second blocking oxide layer may be greater than the thickness of the first tunneling oxide layer.

It is a feature of another embodiment of the present invention to provide a method of manufacturing a silicon-oxide-nitride-oxide-silicon (SONOS) memory device including (a) forming an insulating layer on a semiconductor substrate, (b) forming an active layer on the insulating layer, to be divided into a source region, a drain region, and a channel region, (c) forming a memory node on all exposed surfaces of the channel region, (d) forming a first gate conductive layer on all exposed surfaces of the memory node, and (e) removing the first gate conductive layer formed on a top surface of the memory node.

The memory node is preferably formed by sequentially stacking a tunneling oxide layer, a trapping layer, and a blocking oxide layer on all of the exposed surfaces of the channel region.

In an embodiment of the present invention, a thickness of the tunneling oxide layer is equal to a thickness of the blocking oxide layer.

In another embodiment of the present invention, a thickness of the blocking oxide layer is greater than a thickness of the tunneling oxide layer.

In yet another embodiment of the present invention, in (e), the memory node formed on a top surface of the channel region is removed.

In still another embodiment of the present invention, a second gate conductive layer is formed on the exposed top surface of the memory node after the first gate conductive layer formed on the top surface of the memory node is removed.

Forming the tunneling oxide layer may include sequentially stacking a first tunneling oxide layer on all of the exposed surfaces of the channel region and a second tunneling oxide layer on one side and a portion of a top surface adjacent to the one side of the first tunneling oxide layer.

Forming the trapping layer may include sequentially stacking a first trapping layer on all exposed surfaces of the tunneling oxide layer and a second trapping layer on one side and a portion of a top surface adjacent to the one side of the first trapping layer.

Forming the trapping layer may, however, include sequentially stacking a first trapping layer on all exposed surfaces of the first and second tunneling oxide layers and a second trapping layer on one side and a portion of a top surface adjacent to the one side of the first trapping layer that is formed on the second tunneling oxide layer.

Forming the blocking oxide layer may include sequentially stacking a first blocking oxide layer on all exposed surfaces of the tunneling oxide layer and a second blocking oxide layer on one side and a portion of a top surface adjacent to the one side of the first blocking oxide layer.

However, forming the blocking oxide layer may include sequentially stacking a first blocking oxide layer on all exposed surfaces of the trapping layer and a second blocking oxide layer on one side and a portion of a top surface adjacent to the one side of the first blocking oxide layer that is formed over the second tunneling oxide layer.

Forming the blocking oxide layer may include sequentially stacking a first blocking oxide layer on all exposed surfaces of the first and second trapping layers and a second blocking oxide layer on one side and a portion of a top surface adjacent to the one side of the first blocking oxide layer that is formed on the second trapping layer.

In the SONOS memory devices according to the embodiments of the present invention, at least two data values can be stored in each SONOS memory device. Therefore, the integration density of the semiconductor memory device may be increased by 1.5–2 times the integration density of a conventional SONOS memory device with respect to the shape of the memory node included in the SONOS memory device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
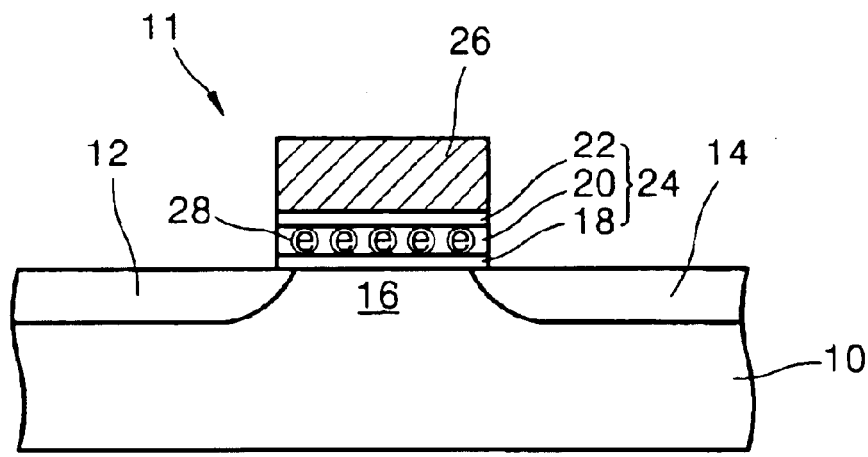
FIG. 1 illustrates a cross-sectional view of a conventional SONOS memory device.

Korean Patent Application No. 2003-1311, filed Jan. 9, 2003, and entitled: "SONOS Memory Device Having Side Gate Stack and Method of Manufacturing the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numerals refer to like elements throughout.

Hereinafter, SONOS memory devices according to the first through third embodiments of the present invention will be described.

<First Embodiment>

Figure 2:
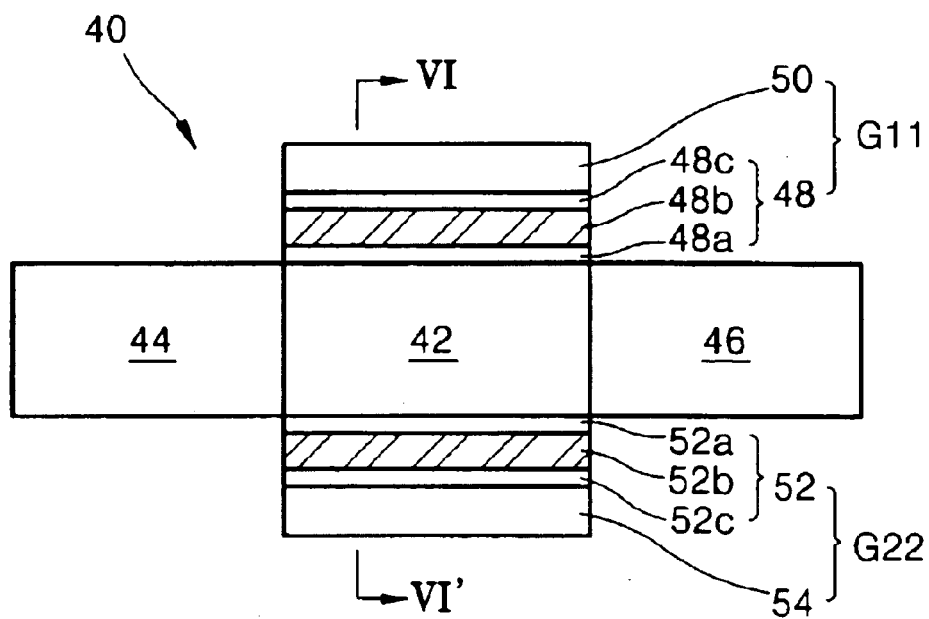
FIG. 2 illustrates a cross-sectional view of a SONOS memory device including side gate stacks according to a first embodiment of the present invention.
Figure 6:
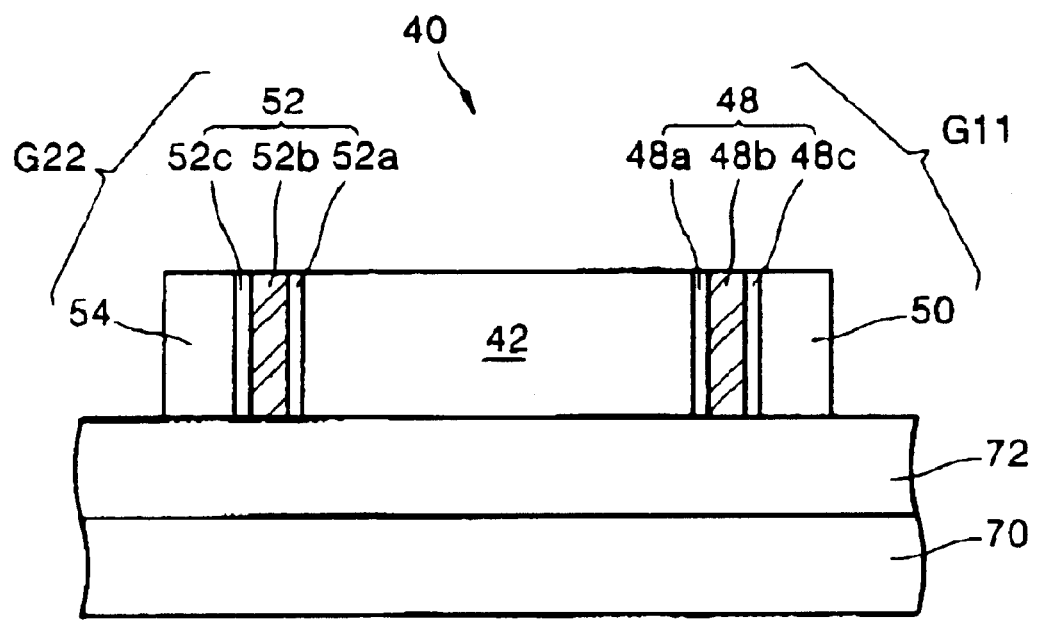
FIG. 6 illustrates a cross-sectional view of FIG. 2 taken along line VI—VI'.

Referring to FIGS. 2 and 6, a SONOS memory device 40 according to a first embodiment of the present invention includes an active layer that is deposited on a predetermined region of an insulating layer 72 formed on a semiconductor substrate 70. The insulating layer 72 is an oxide layer formed on the semiconductor substrate. The active layer is a semiconductor silicon layer. A channel region 42, a source region 44, and a drain region 46 are defined in the active layer. The channel region 42 is defined in a center of the active layer. The source region 44 is defined at one side of the channel region 42. The drain region 46 is defined at the other side of the channel region 42. Thus, the source region 44, the drain region 46, and the channel region 42 are defined in the same active layer. However, an impurity implanted into the source and drain regions 44 and 46 and a concentration thereof may be different from those of the channel region 42. For example, an n-type conductive impurity may be implanted into the source and drain regions 44 and 46 at a predetermined concentration, while a p-type conductive impurity is implanted into the channel region 42 at another predetermined concentration out of consideration for a Debye length.

A first side gate stack G11 is formed at a first side of the channel region 42 between the source region 44 and the drain region 46. A second side gate stack G22 is formed at a second side of the channel region 42 opposite the first side of the channel region 42. The first side gate stack G11 includes a first memory node 48 and a first side gate conductive layer 50 formed at the side of the first memory node 48. The first memory node 48 includes a first tunneling oxide layer 48a contacting a first side of the channel region 42, a first trapping layer 48b formed at a side of the first tunneling oxide layer 48a, and a first blocking oxide layer 48c formed at a side of the first trapping layer 48b. The second side gate stack G22 includes a second memory node 52 and a second side gate conductive layer 54 that are sequentially formed at a second side of the channel region 42. The second memory node 52 includes a second tunneling oxide layer 52a contacting the second side of the channel region 42, a second trapping layer 52b formed at a side of the second tunneling oxide layer 52a, and a second blocking oxide layer 52c formed at a side of the second trapping layer 52b. As shown in FIG. 2, the first and second side gate stacks G11 and G22 are respectively formed at first and second sides of the channel region 42 in a symmetric manner. This arrangement is shown more clearly in FIG. 6, which illustrates a cross-sectional view of FIG. 2 taken along line VI—VI'. Referring to FIG. 6, the source and drain regions 44 and 46 of FIG. 2, which are not shown in FIG. 6, and the first and second side gate stacks G11 and G22 are formed on the insulating layer 72 of the semiconductor substrate 70. The insulating layer 72 may be a buried oxide layer.

<Second Embodiment>

In the second embodiment of the present invention, instead of the second side gate stack G22 of the first embodiment, another side gate stack, which is different from the first and second side gate stacks G11 and G22, is formed at the second side of the channel region 42.

Figure 3:
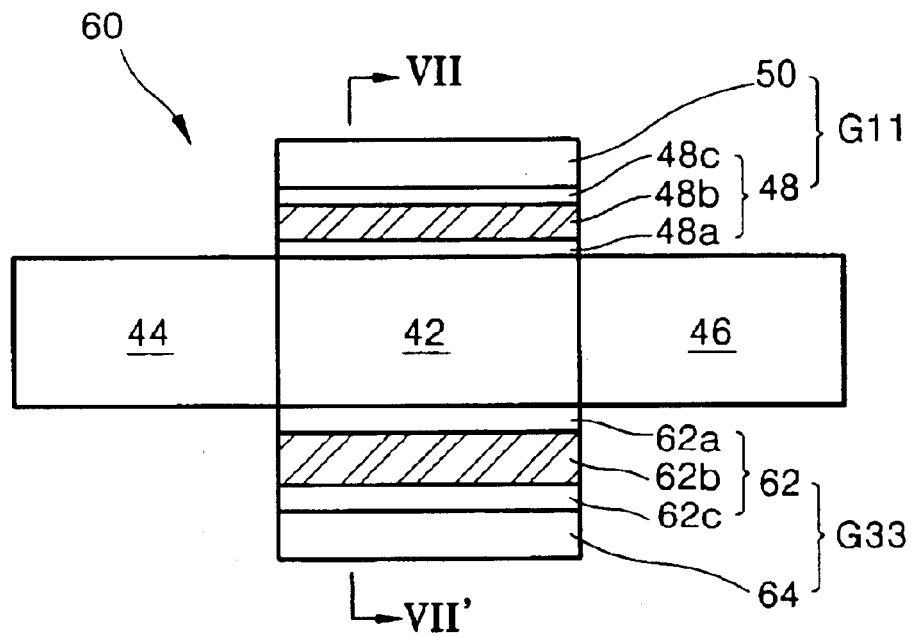
FIG. 3 illustrates a cross-sectional view of a SONOS memory device including side gate stacks according to a second embodiment of the present invention.
Figure 7:
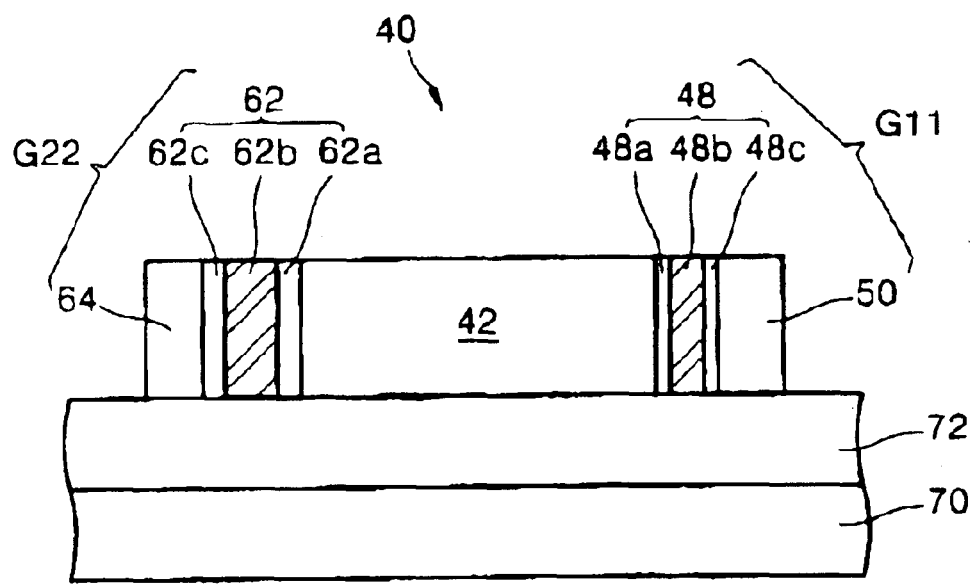
FIG. 7 illustrates a cross-sectional view of FIG. 3 taken along line VII—VII'.

Referring to FIGS. 3 and 7, a SONOS memory device 60 according to a second embodiment of the present invention includes a side gate stack G33 formed at the second side of the channel region 42. The side gate stack G33 includes a memory node 62 contacting the second side of the channel region 42 and a side gate conductive layer 64 formed at a side of the side gate stack G33. The memory node 62 includes a tunneling oxide layer 62a, a trapping layer 62b, and a blocking oxide layer 62c, which are sequentially formed at the second side of the channel region 42. Here, the thickness of the tunneling oxide layer 62a is greater than that of the first tunneling oxide layer 48a. The thickness of the trapping layer 62b is greater than that of the first trapping layer 48b. The thickness of the blocking oxide layer 62c is greater than that of the first blocking oxide layer 48c.

Since the thicknesses of the tunneling oxide layer 62a, the trapping layer 62b, and the blocking oxide layer 62c are respectively different from the thicknesses of the first tunneling oxide layer 48a, the first trapping layer 48b, and the first blocking oxide layer 48c, the first side gate stack G11 and the side gate stack G33 of the second embodiment of the present invention are formed in an asymmetric manner, unlike the first and second side gate stacks G11 and G22 of the first embodiment of the present invention.

Figure 4:
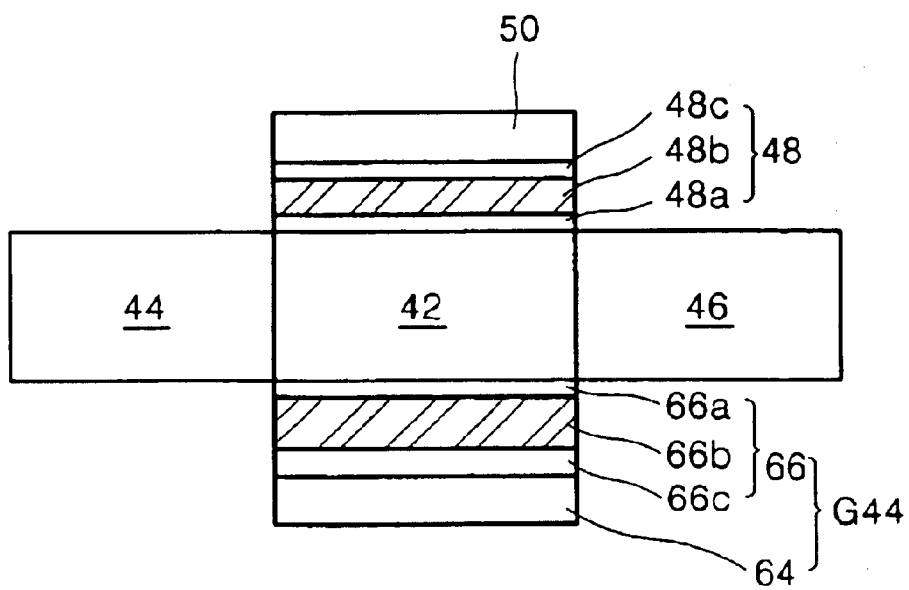
FIGS. 4 and 5 illustrate cross-sectional views showing examples of the SONOS memory device including side gate stacks according to the second embodiment of the present invention.
Figure 5:
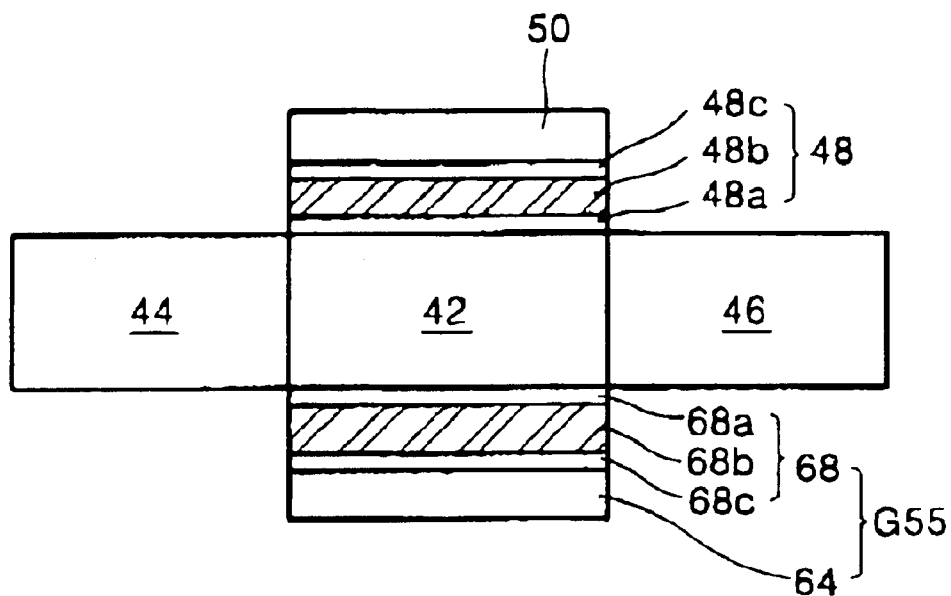

The SONOS memory device 60 according to the second embodiment of the present invention may include modified side gate stacks as shown in FIGS. 4 and 5.

More specifically, the side gate stack G33 of the SONOS memory device 60 of FIG. 3 may be replaced with a side gate stack G44 of FIG. 4. The side gate stack G44 includes a memory node 66 contacting the second side of the channel region 42 and the side gate conductive layer 64 formed at a side of the memory node 66. The memory node 66 includes a tunneling oxide layer 66a, a trapping layer 66b, and a blocking oxide layer 66c. Here, the thickness of the tunneling oxide layer 66a is the same as that of the first tunneling oxide layer 48a.

As shown in FIG. 5, the side gate stack G33 of FIG. 3 may be replaced with a side gate stack G55. The side gate stack G55 includes a memory node 68 and the side gate conductive layer 64, which are sequentially formed on the second side of the channel region 42. The memory node 68 includes a tunneling oxide layer 68a, a trapping layer 68b, and a blocking oxide layer 68c. Here, a thickness of the tunneling oxide layer 68a is the same as that of the first tunneling oxide layer 48a. A thickness of the blocking oxide layer 68c is the same as that of the first blocking oxide layer 48c.

<Third Embodiment>

In a third embodiment of the present invention, a SONOS memory device includes two side gate stacks and one vertical gate stack that share a material layer used as a memory node.

Figure 8:
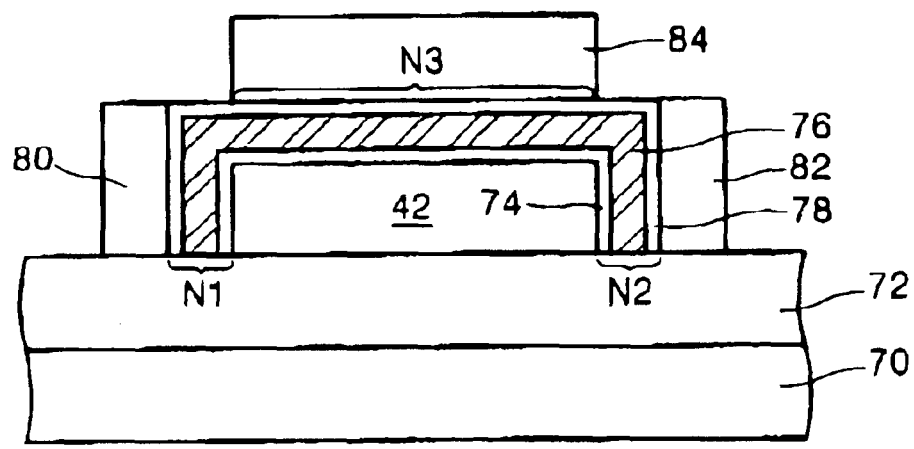
FIG. 8 illustrates a cross-sectional view of a SONOS memory device including side gate stacks according to a third embodiment of the present invention.

Referring to FIG. 8, the insulating layer 72 is formed on the semiconductor substrate 70. The channel region 42 is formed on a predetermined region of the insulating layer 72. All exposed surfaces of the channel region 42, that is, side surfaces and a top surface of the channel region 42 are covered with a tunneling oxide layer 74. All exposed surfaces of the tunneling oxide layer 74 are covered with a trapping layer 76. All exposed surfaces of the trapping layer 76 are covered with a blocking oxide layer 78. The tunneling oxide layer 74, the trapping layer 76, and the blocking oxide layer 78 constitute a memory node including a first part N1, a second part N2, and a third part N3 that cover exposed surfaces of the channel region 42. First and second conductive layers 80 and 82 are formed at first and second sides of the blocking oxide layer 78, respectively. There is a third conductive layer 84 formed on a top surface of the blocking oxide layer 78 between the first and second sides of the blocking oxide layer 78. Since the first through third conductive layers 80, 82, and 84 are gate conductive layers, it is preferable that they do not contact one another.

As described above, the tunneling oxide layer 74, the trapping layer 76, and the blocking oxide layer 78 are sequentially formed on the exposed surfaces of the channel region 42, and the first through third conductive layers 80, 82, and 84 are respectively formed at either side and on the top surface of the blocking oxide layer 78. Thus, the side gate stack including the first conductive layer 80 and the first part N1 of the memory node is formed at the first side of the channel region 42. Another side gate stack including the second conductive layer 82 and the second part N2 of the memory node is formed at the second side of the channel region 42. The vertical gate stack including the third conductive layer 84 and the third part N3 of the memory node is formed on the top surface of the channel region 42.

Therefore, the SONOS memory device according to the third embodiment of the present invention includes a total of three memory elements. More particularly, the SONOS memory device according to the third embodiment of the present invention includes two memory elements, which are connected in parallel, and one memory element, which is vertically connected to the two parallel memory elements. Therefore, the SONOS memory device according to the third embodiment differs from the SONOS memory devices 40 and 60 according to the first and second embodiments, in which only two memory elements are connected in parallel.

As shown in FIG. 8, since the first and second parts N1 and N2 of the memory node included in the side gate stacks at either side of the channel region 42 and the third part N3 included in the vertical gate stack on the top surface of the channel region 42 are connected with one another, the memory node of the third embodiment is considered to be included in each of the two side gate stacks and the vertical gate stack.

However, since electrons are trapped in trap sites of the trapping layer 76, it is difficult for the electrons trapped in the trap sites to move to another region. For example, although a predetermined voltage is applied to the second conductive layer 82 or the third conductive layer 84, the electrons trapped in the trapping layer 76 of the first part N1 do not move to the second part N2 or the third part N3. Thus, a voltage applied to one of the two side gate stacks and/or the vertical gate stack does not affect data written in the remaining gate stacks. For example, a voltage applied to the vertical gate stack to write data thereto does not affect data written in the two side gate stacks.

Preferably, the channel region 42 of the SONOS memory devices according to the first through third embodiments of the present invention is a silicon layer into which a conductive impurity is implanted at a predetermined concentration in consideration of a Debye length. However, the channel region 42 may be a layer including a carbon nano tube (CNT) structure.

Hereinafter, methods of manufacturing the SONOS memory devices according to the first through third embodiments of the present invention will be described.

<Fourth Embodiment>

Figure 9:
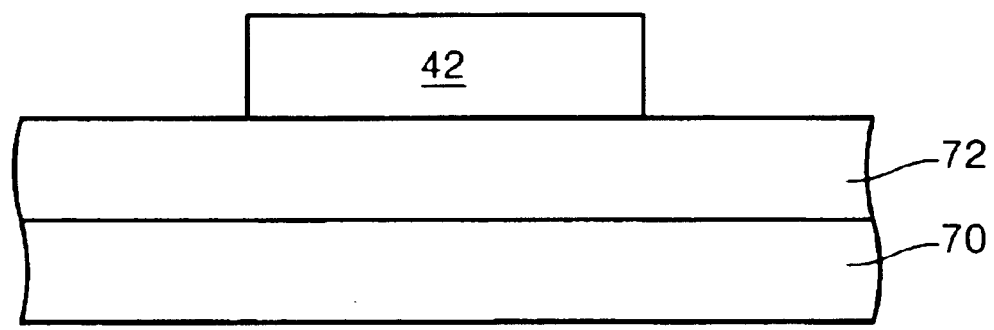
FIGS. 9 through 12 illustrate cross-sectional views for showing stages in a method of manufacturing a SONOS memory device including side gate stacks according to the first embodiment of the present invention.

In the fourth embodiment of the present invention, a method of manufacturing a SONOS memory device according to the first embodiment of the present invention will be described. More particularly, a method of manufacturing a SONOS memory device such as the SONOS memory device 40 of FIGS. 2 and 6 will be described. As shown in FIG. 9, the insulating layer 72 is formed on a predetermined region of the semiconductor substrate 70. The insulating layer 72 may be a buried oxide layer. An active layer is formed on the insulating layer 72 and patterned to form the channel region 42. The active layer is preferably formed of a semiconductor silicon layer. Here, the source and drain regions (not shown) are formed such that they are respectively connected to opposite ends of the channel region 42. Preferably, the channel region 42 is formed of a silicon layer into which a predetermined conductive impurity, for example, a p-type conductive impurity, is implanted. The channel region 42 may be a layer including a CNT structure.

Figure 10:
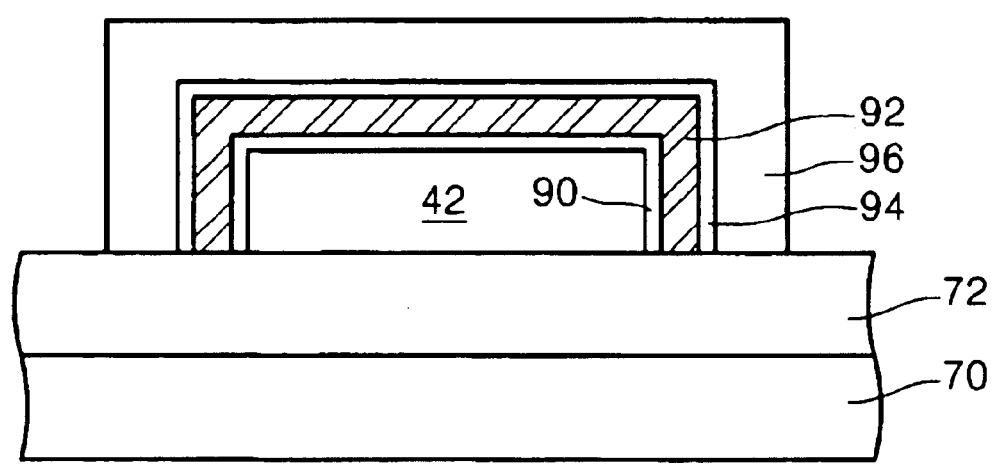

As shown in FIG. 10, a first insulating layer 90 is formed over all exposed surfaces of the channel region 42, i.e., at side and top surfaces of the channel region 42. Preferably, the first insulating layer 90 is formed to be a tunneling oxide layer and having a thickness through which electrons having a predetermined amount of energy can tunnel. After the first insulating layer 90 is formed, a trapping layer 92, in which electrons tunneling from the first insulating layer 90 are trapped, and a second insulating layer 94 are sequentially deposited on all exposed surfaces of the first insulating layer 90. Preferably, the trapping layer 92 is a silicon nitride ($Si_3N_4$) layer but may also be a silicon layer. The second insulating layer 94 is used to prevent a portion of electrons that tunnels from the first insulating layer 90, but is not trapped in the trapping layer 92, from tunneling into the trapping layer 92 during a data write operation. Preferably, the second insulating layer 94 is an oxide layer.

Next, a conductive layer 96 of a predetermined thickness is formed on all exposed surfaces of the second insulating layer 94 to be used as a gate electrode. The conductive layer 96 may be a polysilicon layer, a tungsten silicide layer, or another conductive layer. After the conductive layer 96 is formed, a region of the semiconductor substrate 70 on which the conductive layer 96 is formed is polished. During polishing, the conductive layer 96, the second insulating layer 94, the trapping layer 92, and the first insulating layer 90 are sequentially etched according to different recipes until the top surface of the channel region 42 is exposed.

Figure 11:
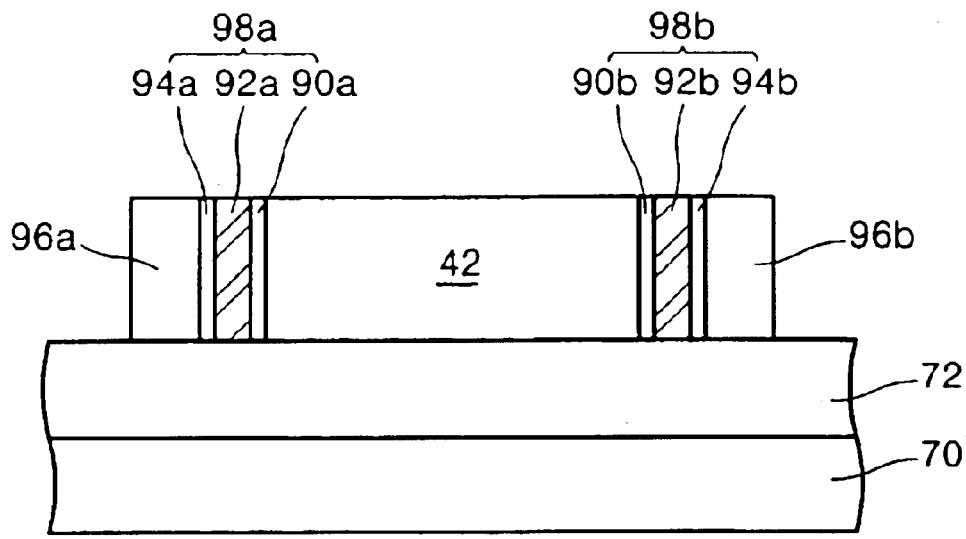

As a result, as shown in FIG. 11, materials stacked on the upper surface of the channel region 42 are removed, and a side gate stack including a first pattern 96a of the conductive layer 96 and a first pattern 98a of a stack including a first pattern 90a of the first insulating layer 90, a first pattern 92a of the trapping layer 92, and a first pattern 94a of the second insulating layer 94, is formed at a first side of the channel region 42. Another side gate stack including a second pattern 96b of the conductive layer 96 and a second pattern 98b of a stack including a second pattern 90b of the first insulating layer 90, a second pattern 92b of the trapping layer 92, and a second pattern 94b of the second insulating layer 94, is formed at a second side of the channel region 42. The side gate stacks are formed symmetrically with respect to each other. The first and second patterns 98a and 98b are used as memory nodes, which can be individually controlled.

Figure 12:
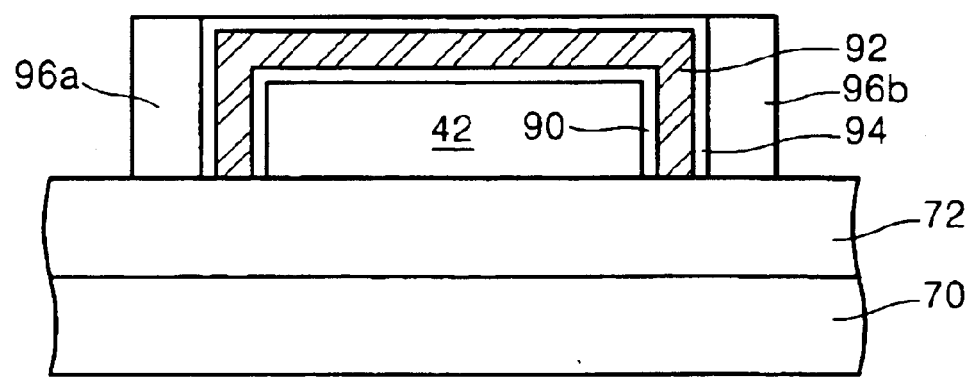

Meanwhile, the polishing may be performed until the second insulating layer 94 is exposed, as shown in FIG. 12. In this case, since the first insulating layer 90, the trapping layer 92, and the second insulating layer 94 are not removed, the side gate stacks formed at either side of the channel region 42 share a memory node including the first insulating layer 90, the trapping layer 92, and the second insulating layer 94. However, as described above, since electrons are trapped in the trapping layer 92, the side gate stacks do not affect each other in a data read or write operation, even though the first and second side gate stacks formed at sides of the channel region 42 share the memory node.

<Fifth Embodiment>

In a fifth embodiment of the present invention, a method of manufacturing a SONOS memory device according to the second embodiment of the present invention will be described. More particularly, in the fifth embodiment, a method of manufacturing a SONOS memory device such as the SONOS memory device 60 of FIG. 7 will be described. Here, identical elements that are common to the first and second embodiments are designated by identical reference numerals and will not be described again. However, in the following description, a first and second side of the channel region 42 are reversed from those of FIG. 7.

Figure 13:
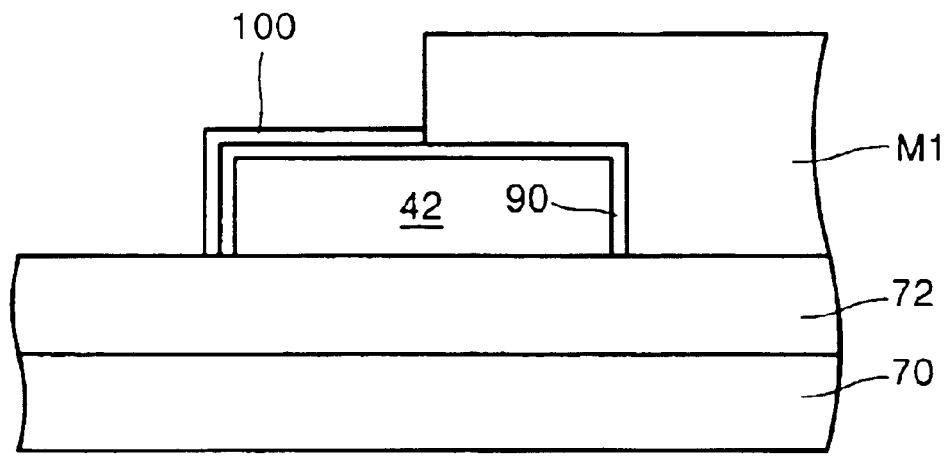
FIGS. 13 through 18 illustrate cross-sectional views for showing stages in a method of manufacturing a SONOS memory device including side gate stacks according to the second embodiment of the present invention.

Referring to FIG. 13, the insulating layer 72 is formed on the semiconductor substrate 70. An active layer is formed on the insulating layer 72 and the active layer is patterned to form the channel region 42. Here, a source region (not shown) is formed at one side of the channel region 42, and a drain region (not shown) is formed at the other side of the channel region 42. In other words, the channel region 42, the source region, and the drain region are formed in different regions on the same layer. The first insulating layer 90 is formed on exposed surfaces of the channel region 42. Then, the insulating layer 72 and the first insulating layer 90 are coated with a first photoresist film (not shown). The first photoresist film is then exposed and developed to form a first photoresist film pattern M1 which covers the right side of the first insulating layer 90 and a portion, preferably half, of the top surface of the first insulating layer 90. A second insulating layer 100 is formed on the remaining portion of the first insulating layer 90 by using the first photoresist film pattern M1 as a mask. Preferably, the second insulating layer 100 is formed of a same material and to a same thickness as the first insulating layer 90. However, the second insulating layer 100 may be formed of a different material than the first insulating layer 90, and may have a different thickness than that of the first insulating layer 90, provided electrons can tunnel into the second insulating layer 100 together with the first insulating layer 90. After the second insulating layer 100 is formed, the first photoresist film pattern M1 is removed.

The second insulating layer 100 is not formed on a region having the first photoresist film pattern M1. Thus, a first step between a region having the second insulating layer 100 and a region not having the second insulating layer 100 is formed on the top surface of the channel region 42 and has a height equal to the thickness of the second insulating layer 100. Since the second insulating layer 100 is not formed at the right side of the first insulating layer 90, thicknesses of the right and left sides of the channel region 42 are different from each other. That is, the thickness of the insulating layers formed at a first, or left, side of the channel region 42 is greater than that of the insulating layer formed at a second, or right, side of the channel region 42.

Figure 14:
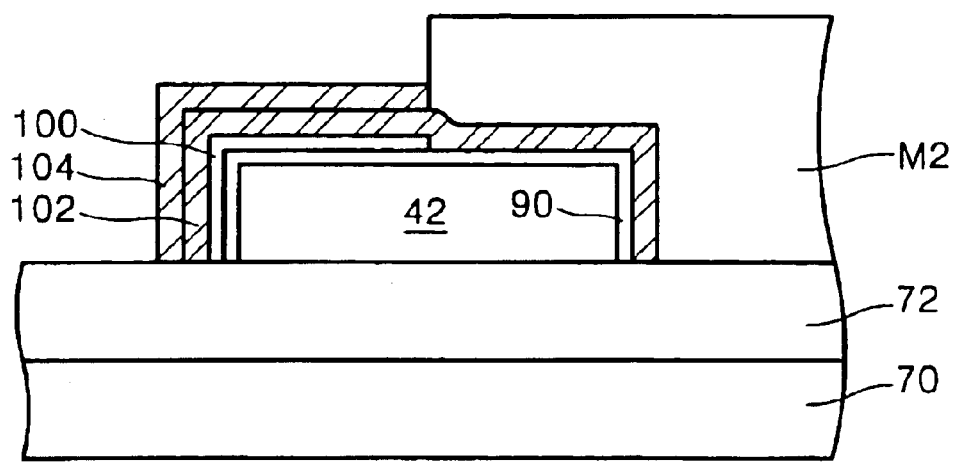

Referring to FIG. 14, a first trapping layer 102 of a predetermined thickness is formed on all exposed surfaces of the second insulating layer 100 and the first insulating layer 90. Preferably, the first trapping layer 102 is formed of a same material and to a same thickness as the trapping layer 92 of the first embodiment of the present invention (FIGS. 10 and 12). Subsequently, the insulating layer 72 and the first trapping layer 102 are coated with a second photoresist film (not shown). The resultant structure, coated with the second photoresist film, is then processed by a photo process to form a second photoresist film pattern M2 that covers the right side of the first trapping layer 102 and a portion, preferably half, of a top surface of the first trapping layer 102. A second trapping layer 104 is formed on the remaining portion of the first trapping layer 102 by using the second photoresist film pattern M2 as a mask. Preferably, the second trapping layer 104 is formed of the same material and to the same thickness as the first trapping layer 102. However, the second trapping layer 104 may be formed of a different material and to a different thickness that the first trapping layer 102, provided electrons can tunnel into the second trapping layer 104. For example, the first trapping layer 102 may be a silicon nitride layer, and the second trapping layer 104 may be a silicon layer, or the materials may be reversed. In addition, the thicknesses of the first and second trapping layers 102 and 104 may be in a ratio of, for example, 1 to 2.

After the second trapping layer 104 is formed, the second photoresist film pattern M2 is removed from the insulating layer 72.

Since the second trapping layer 104 is not formed in a region having the second photoresist film pattern M2, a third step between a region having the second trapping layer 104 and a region not having the second trapping layer 104 is formed on the channel region 42. The third step includes the first step between the region having the second insulating layer 100 and the region not having the second insulating layer 100 and a second step of the second trapping layer 104. Since the second trapping layer 104 is not formed at the right side of the first trapping layer 102, the thickness of the trapping layers formed at a first, or left, side of the channel region 42 is greater than that of the trapping layer formed at a second, or right, side of the channel region 42.

Figure 15:
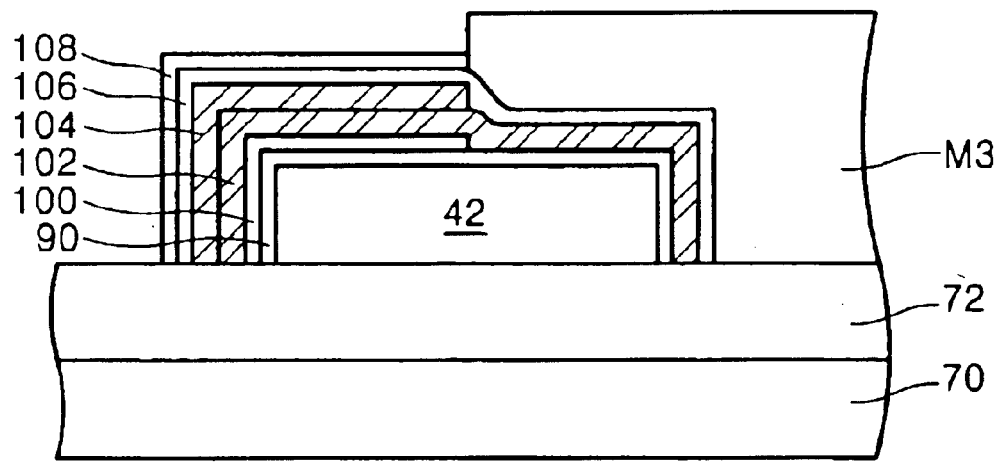

Referring to FIG. 15, a third insulating layer 106 of a predetermined thickness is formed on all exposed surfaces of a resultant having the second trapping layer 104. The third insulating layer 106 is a first barrier used to prevent electrons from tunneling into the first and second trapping layers 102 and 104. Preferably, the third insulating layer 106 is formed of a same kind of oxide layer as the second insulating layer 100, but may be formed of another type of oxide layer. All exposed surfaces of a resultant structure having the third insulating layer 106 are coated with a photoresist film (not shown), and the photoresist film is patterned using a photo process to form a third photoresist film pattern M3, which covers the right side of the third insulating layer 106 and a portion, preferably half, of a top surface of the third insulating layer 106. A fourth insulating layer 108 is formed on exposed surfaces of the third insulating layer 106 by using the third photoresist film pattern M3 as a mask. The fourth insulating layer 108 is used as a second barrier, which prevents electrons from tunneling into the first and second trapping layers 102 and 104. Preferably, the fourth insulating layer 108 is formed of the same material as the third insulating layer 106 but may be formed of another type of insulating material. After the fourth insulating layer 108 is formed, the third photoresist film pattern M3 is removed.

Since the fourth insulating layer 108 is formed at the left side of and on a portion of a top surface of the third insulating layer 106, after the third photoresist film pattern M3 is removed, a fourth step between a region having the fourth insulating layer 108 and a region not having the fourth insulating layer 108 is formed on the channel region 42. Since the fourth insulating layer 108 is not formed at the right side of the third insulating layer 106, the thickness of the barrier layers formed at the first, or left, side of the channel region 42 having the fourth insulating layer 108 is greater than that of the barrier layer formed at the second, or right, side of the channel region 42 by the thickness of the fourth insulating layer 108.

Figure 16:
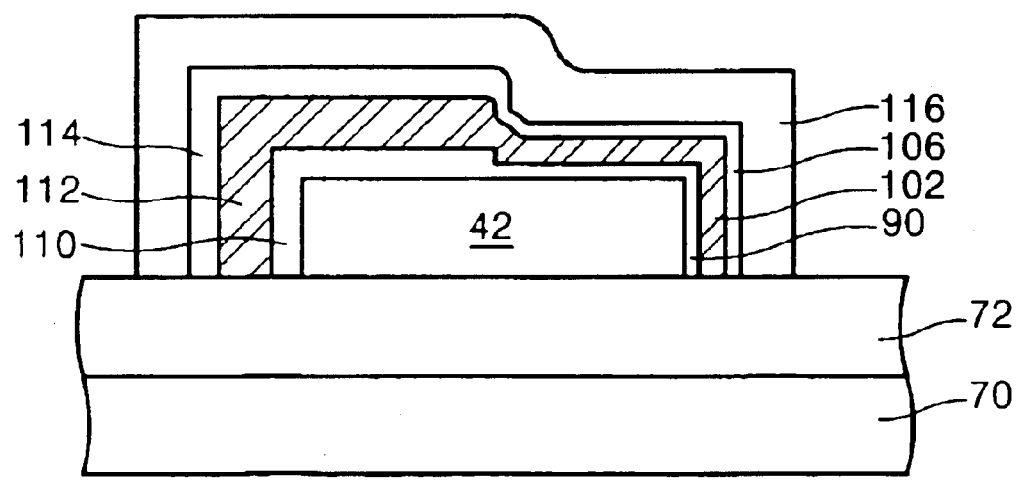
Figure 17:
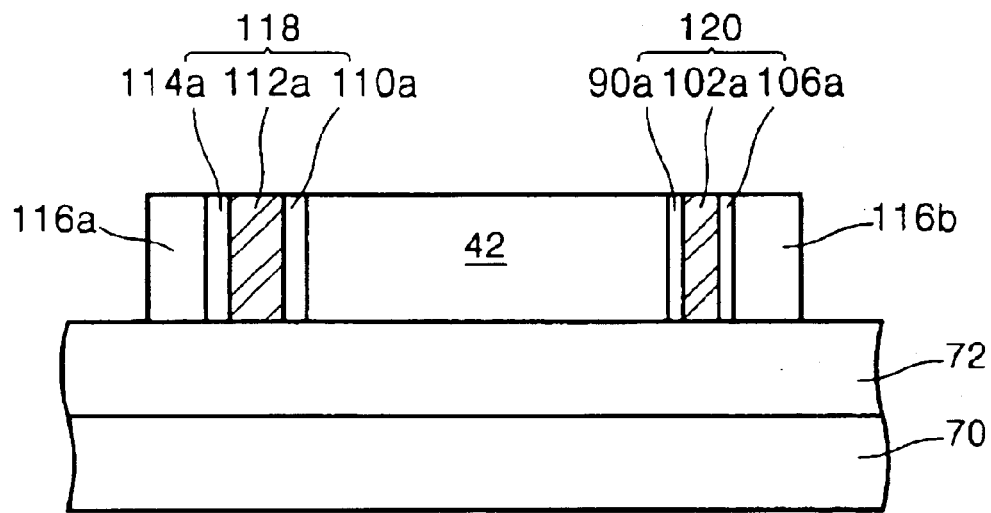
Figure 18:
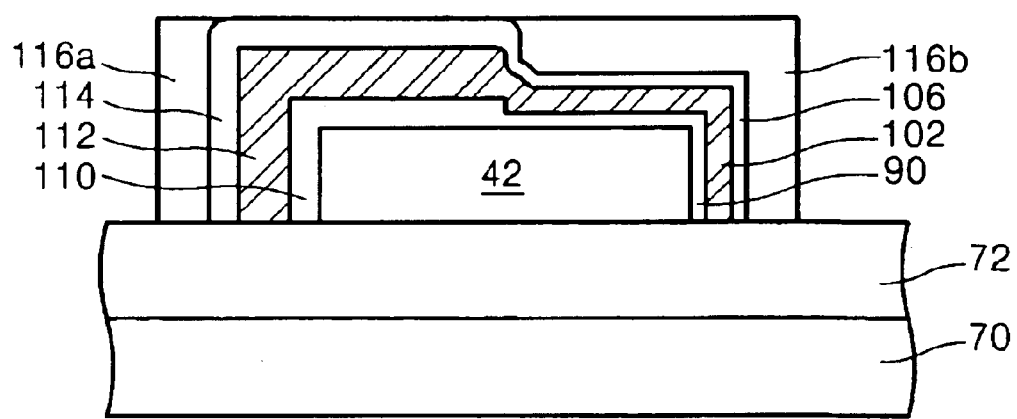

Since it is preferable that the first and second insulating layers 90 and 100 are formed of the same kind of oxide layer, in FIGS. 16 through 18, an insulating layer including the first and second insulating layers 90 and 100 will be referred to as a fifth insulating layer 110, which has a thickness equal to the total thickness of the first and second insulating layers 90 and 100 shown in FIGS. 13 through 15.

For a similar reason, in FIGS. 16 through 18, the first and second trapping layers 102 and 104 will be referred to as a third trapping layer 112 which has a thickness equal to the total thickness of the first and second trapping layers 102 and 104 in FIGS. 14 and 15.

Similarly, in FIGS. 13 through 18, an insulating layer including the third and fourth insulating layers 106 and 108 will be referred to as a sixth insulating layer 114, which has a thickness equal to the total thickness of the third and fourth insulating layers 106 and 108 in FIG. 15.

Referring to FIG. 16, after the third photoresist film pattern M3 is removed, a conductive layer 116 of a predetermined thickness is formed on all exposed surfaces of the sixth and third insulating layers 114 and 106. A resultant structure having the conductive layer 116 is sequentially polished according to a process recipe until the channel region 42 is exposed. As a result, a left side gate stack and a right side gate stack are respectively formed at the left and right sides of the channel region 42. The left side gate stack includes a first pattern 116a of the conductive layer 116 and a memory node 118 formed at the first, or left, side of the channel region 42. The right side gate stack includes a second pattern 116b of the conductive layer 116 and a memory node 120 formed at the second, or right, side of the channel region 42. The memory node 118 of the left side gate stack includes an insulating layer pattern 110a, a trapping layer pattern 112a, and an insulating layer pattern 114a. The memory node 120 of the right side gate stack includes an insulating layer pattern 90a, a trapping layer pattern 102a, and an insulating layer pattern 106a, as illustrated in FIG. 17.

As shown in FIG. 17, thicknesses of the memory nodes 118 and 120 are different from each other. Thus, the left and right side gate stacks are formed at sides of the channel region 42 asymmetrically with respect to each other.

As described above, since it is difficult for electrons trapped in the first and third trapping layers 102 and 112 to move to other regions according to the first and third trapping layers 102 and 112, a resultant structure on the top surface of the channel region 42 may not be removed while a resultant structure having the conductive layer 116, as illustrated in FIG. 16, is polished. Thus, the resultant structure having the conductive layer 116 may be polished until the sixth insulating layer 114 is exposed, as illustrated in FIG. 18. Here, the top surface of the third insulating layer 106 is covered with the second pattern 116b of the conductive layer 116.

<Sixth Embodiment>

In a sixth embodiment of the present invention, a SONOS memory device according to the third embodiment of the present invention, such as that shown in FIG. 8, may be achieved by forming a second conductive layer similar to the third conductive layer 84 of FIG. 8 on the second insulating layer 94 over the top surface of the channel region 42 of the structure shown in FIG. 12.

Hereinafter, operation characteristics of the SONOS memory devices according to the first through third embodiments of the present invention will be described.

FIGS. 19 through 23 are graphs showing operation characteristics of SONOS memory devices according to the first and second embodiments of the present invention.

Figure 19:
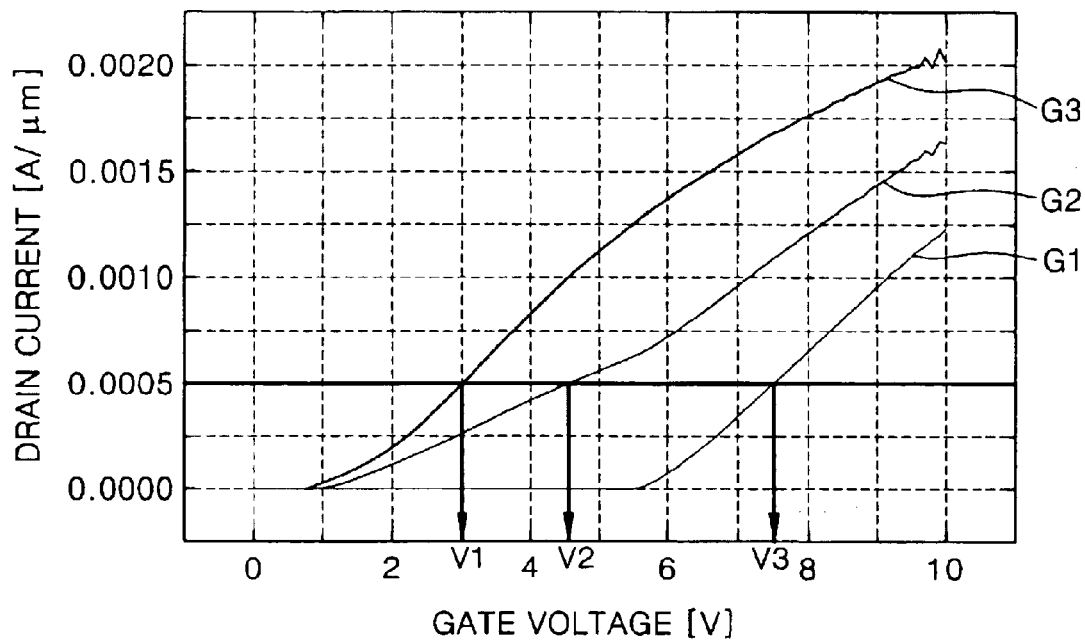
FIG. 19 is a graph showing operation characteristics of a SONOS memory device including side gate stacks according to the first embodiment of the present invention.

FIG. 19 shows operation characteristics of a SONOS memory device according to the first embodiment of the present invention, in which two oxide-nitride-oxide (ONO) memory nodes, i.e., first and second ONO memory nodes, are formed at sides of the channel region symmetrically with respect to each other. Here, layers constituting each of the two ONO memory nodes have thicknesses of 20 nm, 60 nm, and 40 nm, respectively.

FIGS. 20 through 23 show operation characteristics of SONOS memory devices according to the second embodiment of the present invention, in which two ONO memory nodes, i.e., first and second ONO memory nodes, are formed at sides of the channel region asymmetrically with respect to each other. Here, layers constituting the first ONO memory node have different thicknesses then layers constituting the second ONO memory node. In this case, the second ONO memory node has a thickness greater than that of the first ONO memory node.

Figure 20:
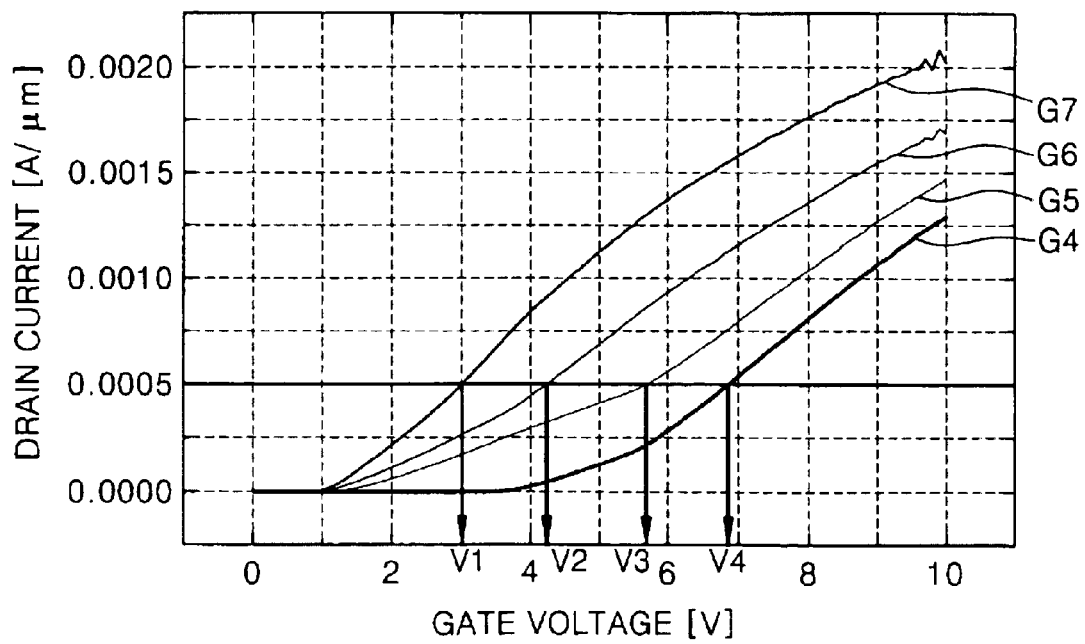
FIGS. 20 through 23 are graphs showing operation characteristics of a SONOS memory device including side gate stacks according to the second embodiment of the present invention.
Figure 21:
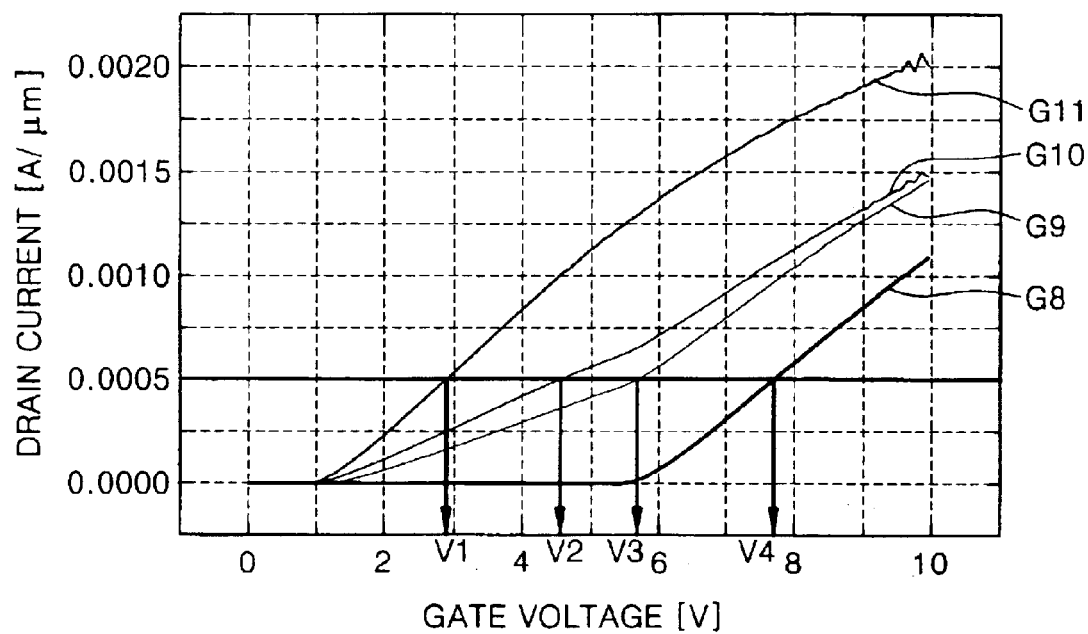
Figure 22:
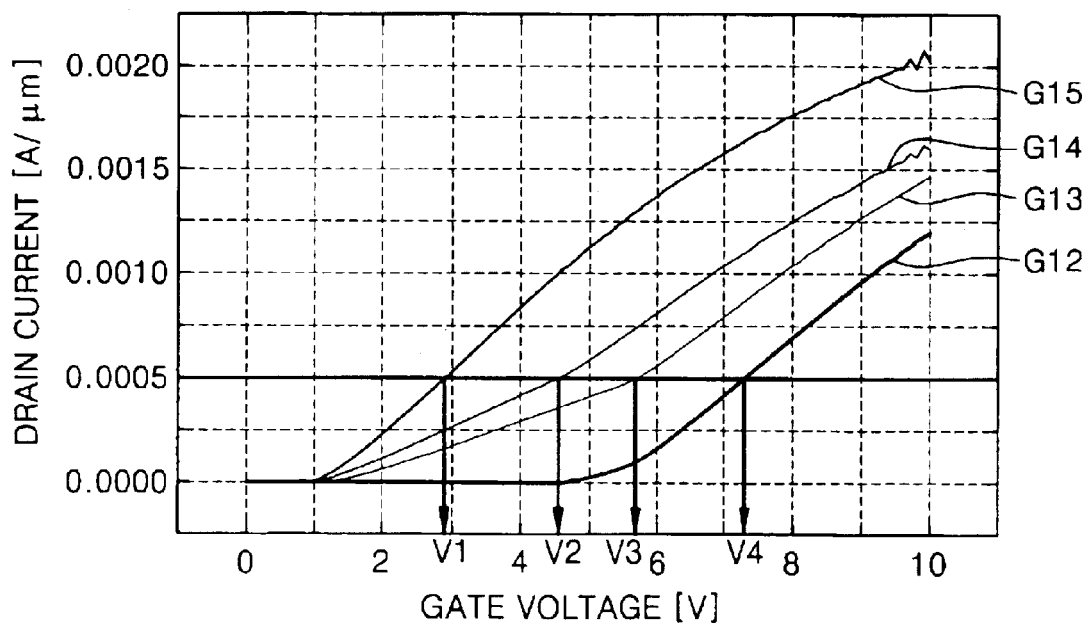
Figure 23:
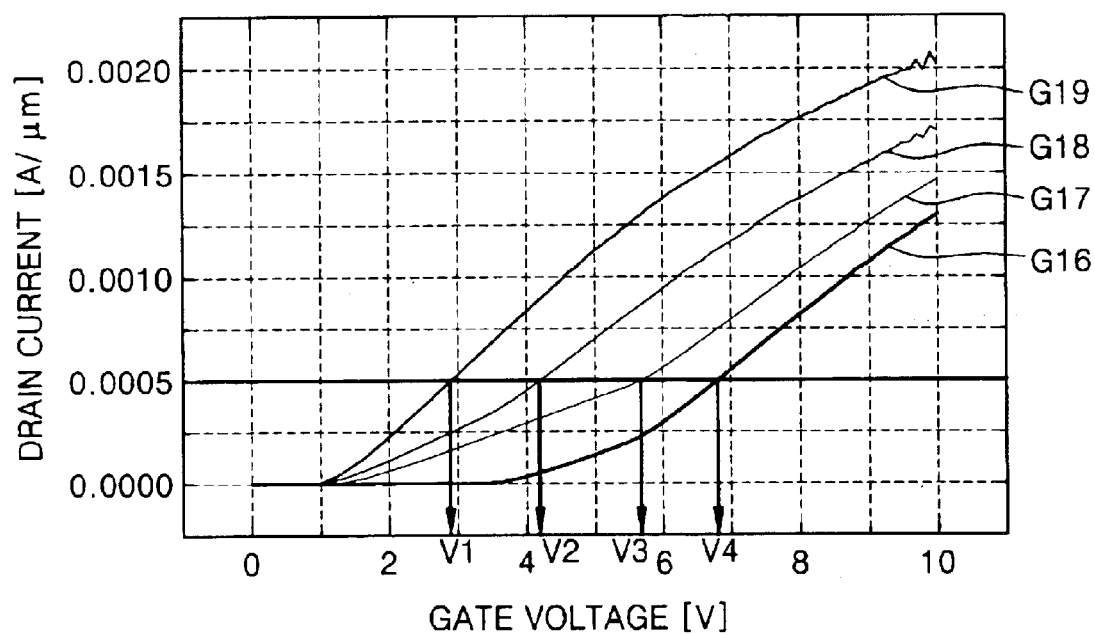

More specifically, FIG. 20 shows operation characteristics where layers constituting the first ONO memory node (hereinafter referred to as a first node), having a smaller thickness than that of the second ONO memory node, have thicknesses of 20 nm, 60 nm, and 40 nm, respectively; and layers constituting the second ONO memory node (hereinafter referred to as a second node) have thicknesses of 20 nm, 60 nm, and 80 nm, respectively. FIG. 21 shows operation characteristics in which layers constituting the second node have thicknesses of 20 nm, 60 nm, and 50 nm, respectively. FIGS. 22 and 23 show operation characteristics in which layers constituting the second node respectively have thicknesses of 20 nm, 60 nm, and 60 nm and 20 nm, 60 nm, and 70 nm, respectively.

In FIG. 19, first through third graphs G1, G2, and G3 respectively show operation characteristics when electrons are trapped in both the first node and the second node formed symmetrically with respect to each other (hereinafter referred to as a first case), when the electrons are trapped in either the first node or the second node only (hereinafter referred to as a second case), and when the electrons are trapped in neither the first node nor the second node (hereinafter referred to as a third case).

The SONOS memory devices according to the embodiments of the present invention include two side gate stacks at the first and second sides of the channel region. Thus, although only one channel region is used, two channel areas within the channel region are respectively used for each side gate stack. Therefore, a drain current, for example, 0.0005 A/μm, estimated in the channel region during a data read operation is the total drain current estimated in the two channel areas respectively used for each side gate stack when predetermined read voltages are applied to the side gate stacks formed at the first and second sides of the channel region.

Referring to the first through third graphs G1, G2, and G3, predetermined voltages are applied to the side gate stacks to estimate drain currents in the channel region. In the first case, a third voltage V3 is applied to the side gate stacks. In the second case, a second voltage V2 that is lower than the third voltage V3 is applied to the side gate stacks. In the third case, a first voltage V1 that is lower than the second voltage V2 is applied to the side gate stacks.

Referring to Table 1, the first voltage V1 is 2.9V; the second voltage V2 is 4.55V; and the third voltage V3 is 7.5V. A voltage difference ΔV1 between the first and second voltages V1 and V2 is 1.65V. A voltage difference ΔV2 between the second and third voltages V2 and V3 is 2.95V.

TABLE 1

| Thickness of layers of ONO memory node | 20nm/60nm/40nm | Voltage difference |
|---|---|---|
| First voltage V1 | 2.9 V | ΔV1 (V2–V1): 1.65V |
| Second voltage V2 | 4.55 V | ΔV2 (V3–V2): 2.95V |
| Third voltage V3 | 7.5 V | |

Since the voltage differences ΔV1 and ΔV2 are large enough to distinguish from among the first through third cases, two data values can be written in the SONOS memory device according to the first embodiment of the present invention.

Referring to FIG. 20, fourth through seventh graphs G4, G5, G6, and G7 respectively show operation characteristics when electrons are trapped in both the first node and the second node (hereinafter referred to as a fourth case), when electrons are trapped in the first node only (hereinafter referred to as a fifth case), when the electrons are trapped in the second node only (hereinafter referred to as a sixth case), and when the electrons are trapped in neither the first node nor the second node (hereinafter referred to as a seventh case).

Referring to the fourth through seventh graphs G4, G5, G6, and G7, predetermined voltages are applied to the side gate stacks to estimate a drain current, for example, 0.0005 A/μm, in the channel region. In the fourth case, a fourth voltage V4 is applied to the side gate stacks. In the fifth case, a third voltage V3 that is lower than the fourth voltage V4 is applied to the side gate stacks. In the sixth case, a second voltage V2 that is lower than the third voltage V3 is applied to the side gate stacks. In the seventh case, a first voltage V1 that is lower than the second voltage V2 is applied to the side gate stacks.

Referring to Table 2, the first voltage V1 is 2.9V; the second voltage V2 is 4.3V; the third voltage V3 is 5.7V; and the fourth voltage V4 is 6.85V. A voltage difference ΔV1 between the first and second voltages V1 and V2 is 1.4V. A voltage difference ΔV2 between the second and third voltages V2 and V3 is 1.4V. A voltage difference ΔV3 between the third and fourth voltages V3 and V4 is 1.15V.

TABLE 2

| Thickness of layers of ONO memory node | First node Second node | 20nm/60nm/40nm 20nm/60nm/80nm | Voltage difference |
|---|---|---|---|
| First voltage V1 | | 2.9 V | ΔV1 (V2–V1): 1.4 V |
| Second voltage V2 | | 4.3 V | ΔV2 (V3–V2): 1.4 V |
| Third voltage V3 | | 5.7 V | ΔV3 (V4–V3): 1.15 V |
| Fourth voltage V4 | | 6.85 V | |

Since the voltage differences ΔV1, ΔV2, and ΔV3 are large enough to distinguish from among the fourth through seventh cases, three data values can be written in the SONOS memory device according to the second embodiment of the present invention.

FIGS. 21 through 23 relate to a case similar to that presented in FIG. 20, but in which layers constituting the second node, particularly, a thickness of blocking oxide layers such as blocking oxide layer 62c of FIG. 3, are different from one another. Eighth through eleventh graphs G8–G11 of FIG. 21, twelfth through fifteenth graphs G12–G15 of FIG. 22, and sixteenth through nineteenth graphs G16–G19 of FIG. 23 have similar patterns to the fourth through seventh graphs G4–G7 of FIG. 20. The similar patterns among the fourth through nineteenth graphs G4–G19 indicate that, although the thickness of the third blocking oxide layer 62c of the third side gate stack G33 shown in FIG. 3 is changed, all the operation characteristics of the SONOS memory device according to the second embodiment of the present invention remain unchanged.

As described above, SONOS memory devices according to embodiments of the present invention include two memory nodes at sides of a channel region. That is, the SONOS memory devices have a structure in which two SONOS memory devices are connected in parallel. The two SONOS memory devices may include three memory elements, two of which are connected in parallel and one of which is vertically connected to the two parallel memory elements. The two SONOS memory devices are formed symmetrically or asymmetrically with respect to each other at sides of the channel region. The two SONOS memory devices connected in parallel may be individually controlled. In addition, the SONOS memory devices each have at least three threshold voltages with respect to a layout of the two SONOS memory devices included in each SONOS memory device. Voltage differences between the threshold voltages are large enough to distinguish stored data. Thus, since at least two bits of data are stored in each SONOS memory device, the integration density of the semiconductor memory device may be increased by 1.5–2 times the integration density of a conventional SONOS memory device with respect to a layout of the memory nodes included in the SONOS memory device in a same area.

Preferred embodiments of the present invention have been disclosed herein and, although specific terms are employed, they are used and are to be interpreted in a generic and descriptive sense only and not for purpose of limitation. For example, the trapping layer may be a silicon layer, a silicon nitride layer, or another layer that allows electrons to be trapped therein, and may further be a multi-layer. In addition, when the first and second side gate stacks are formed at sides of a channel region symmetrically with respect to each other, a first blocking oxide layer may have a thickness greater than that of a first tunneling oxide layer constituting a memory node of the first side gate stack, and a second blocking oxide layer may have a thickness greater than that of a second tunneling oxide layer constituting a memory node of the second side gate stack. In such a case, if the first and second tunneling oxide layers have the same thickness and the first and second blocking oxide layers have the same thickness, the first and second gate stacks can be formed symmetrically with respect to each other.

Accordingly, it will be understood by those of ordinary skill in the art that various changes in form and details may be made without departing from the spirit and scope of the present invention as set forth in the following claims.

What is claimed is:

1. A silicon-oxide-nitride-oxide-silicon (SONOS) memory device, comprising:
   a semiconductor substrate;
   an insulating layer formed on the semiconductor substrate;
   an active layer formed on a predetermined region of the insulating layer and divided into a source region, a drain region, and a channel region;
   a first side gate stack formed at a first side of the channel region; and
   a second side gate stack formed at a second side of the channel region opposite the first side of the channel region.

2. The SONOS memory device as claimed in claim 1, wherein the active layer is a semiconductor silicon layer.

3. The SONOS memory device as claimed in claim 1, wherein the active layer has a carbon nano tube structure.

4. The SONOS memory device as claimed in claim 1, wherein the first and second side gate stacks are formed symmetrically with respect to each other.

5. The SONOS memory device as claimed in claim 1, wherein the first and second side gate stacks are formed asymmetrically with respect to each other.

6. The SONOS memory device as claimed in claim 4, wherein the first side gate stack includes a first memory node and a first side gate conductive layer that are sequentially stacked at the first side of the channel region, and the second side gate stack includes a second memory node and a second side gate conductive layer that are sequentially stacked at the second side of the channel region.

7. The SONOS memory device as claimed in claim 6, wherein the first and second memory nodes are extended over a top surface of the channel region and are connected to each other.

8. The SONOS memory device as claimed in claim 6, wherein the first memory node includes a first tunneling oxide layer, a first trapping layer, and a first blocking oxide layer that are sequentially stacked at the first side of the channel region, and the second memory node includes a second tunneling oxide layer, a second trapping layer, and a second blocking oxide layer that are sequentially stacked at the second side of the channel region.

9. The SONOS memory device as claimed in claim 7, wherein the first memory node includes a first tunneling oxide layer, a first trapping layer, and a first blocking oxide layer that are sequentially stacked at the first side of the channel region, and the second memory node includes a second tunneling oxide layer, a second trapping layer, and a second blocking oxide layer that are sequentially stacked at the second side of the channel region.

10. The SONOS memory device as claimed in claim 8, wherein thicknesses of the first and second tunneling oxide layers are equal to each other.

11. The SONOS memory device as claimed in claim 10, wherein thicknesses of the first and second blocking oxide layers are equal to each other.

12. The SONOS memory device as claimed in claim 11, wherein the thicknesses of the first and second blocking oxide layers are respectively greater than thicknesses of the first and second tunneling oxide layers.

13. The SONOS memory device as claimed in claim 5, wherein the first side gate stack includes a first memory node and a first side gate conductive layer that are sequentially stacked at the first side of the channel region, and the second side gate stack includes a second memory node and a second side gate conductive layer that are sequentially stacked at the second side of the channel region.

14. The SONOS memory device as claimed in claim 13, wherein the first and second memory nodes are extended over a top surface of the channel region and are connected to each other.

15. The SONOS memory device as claimed in claim 13, wherein the first memory node includes a first tunneling oxide layer, a first trapping layer, and a first blocking oxide layer that are sequentially stacked at the first side of the channel region, and the second memory node includes a second tunneling oxide layer, a second trapping layer, and a second blocking oxide layer that are sequentially stacked at the second side of the channel region.

16. The SONOS memory device as claimed in claim 14, wherein the first memory node includes a first tunneling oxide layer, a first trapping layer, and a first blocking oxide layer that are sequentially stacked at the first side of the channel region, and the second memory node includes a second tunneling oxide layer, a second trapping layer, and a second blocking oxide layer that are sequentially stacked at the second side of the channel region.

17. The SONOS memory device as claimed in claim 15, wherein a thickness of the first tunneling oxide layer is equal to a thickness of the first blocking oxide layer.

18. The SONOS memory device as claimed in claim 17, wherein a thickness of the second tunneling oxide layer is equal to a thickness of the second blocking oxide layer.

19. The SONOS memory device as claimed in claim 18, wherein the thicknesses of the second tunneling oxide layer and the second blocking oxide layer are respectively greater than the thicknesses of the first tunneling oxide layer and the first blocking oxide layer.

20. The SONOS memory device as claimed in claim 17, wherein the thickness of the first tunneling oxide layer is equal to a thickness of the second tunneling oxide layer, and a thickness of the second blocking oxide layer is greater than the thickness of the first blocking oxide layer.

21. The SONOS memory device as claimed in claim 17, wherein a thickness of the first trapping layer is smaller than a thickness of the second trapping layer.

22. The SONOS memory device as claimed in claim 21, wherein at least one of a thickness of the second tunneling oxide layer and a thickness of the second blocking oxide layer is greater than the thickness of the first tunneling oxide layer.

23. The SONOS memory device as claimed in claim 17, wherein a thickness of the first trapping layer is equal to a thickness of the second trapping layer, and a thickness of at least one of the second tunneling oxide layer and the second blocking oxide layer is greater than the thickness of the first tunneling oxide layer.

24. The SONOS memory device as claimed in claim 14, wherein a gate conductive layer is formed on the first and second memory nodes that are extended over the top surface of the channel region and connected to each other.

* * * * *